United States Patent
Narukawa et al.

(10) Patent No.: US 6,846,597 B2
(45) Date of Patent: Jan. 25, 2005

(54) PHOTOMASK INSPECTING METHOD

(75) Inventors: Syogo Narukawa, Shinjuku-ku (JP);
Kiyoshi Yamazaki, Shinjuku-ku (JP);
Hideyuki Nara, Shinjuku-ku (JP); Yuji
Machiya, Shinjuku-ku (JP); Tatsuya
Tomita, Shinjuku-ku (JP)

(73) Assignee: Dai Nippon Printing Co., Ltd. (JP)

( * ) Notice: Subject to any disclaimer, the term of this patent is extended or adjusted under 35 U.S.C. 154(b) by 155 days.

(21) Appl. No.: 10/270,246

(22) Filed: Oct. 15, 2002

(65) Prior Publication Data
US 2003/0073010 A1 Apr. 17, 2003

(30) Foreign Application Priority Data
Oct. 16, 2001 (JP) ........................................ 2001-318502

(51) Int. Cl.[7] ............................... G03F 9/00; G06K 9/00
(52) U.S. Cl. .......................................... 430/5; 382/144
(58) Field of Search ............................... 430/5; 382/144

(56) References Cited
U.S. PATENT DOCUMENTS
5,849,440 A * 12/1998 Lucas et al. ................... 430/5
6,656,648 B2 * 12/2003 Inoue ........................... 430/30

* cited by examiner

Primary Examiner—Saleha R. Mohamedulla
(74) Attorney, Agent, or Firm—Parkhurst & Wendel, L.L.P.

(57) ABSTRACT

A photomask with a dummy pattern is inspected in a predetermined detection sensitivity by using photomask pattern data designating a photomask with a dummy pattern to detect defects in the photomask. Coordinates indicating the positions of the defects are also determined. The defects in a design pattern area and those in a dummy pattern area are discriminated by using defect-discriminating data. The defects in the design pattern area and those in the dummy pattern area are examined on the basis of respective inspection specifications.

5 Claims, 5 Drawing Sheets (a)

(b) LOGICAL/AND
A&B (c) LOGICAL/OR
A+B (d) INVERSE/NOT
(NOT B)

PHOTOMASK INSPECTING METHOD

TECHNICAL FIELD

The present invention relates to a photomask inspecting method for inspecting a photomask with a dummy pattern for forming a planar processed layer on a wafer in fabricating a semiconductor device for defects.

BACKGROUND ART

The recent trend of miniaturization and performance-advancement of electronic apparatus demands further increase in the scale of integration and further enhancement of functions of various LSICs represented by ASICs. Such demand requires the development of semiconductor device fabricating techniques capable of forming a processed layer on a wafer in higher planarity meeting quality requirements.

A technique of forming a multilayer structure having a planar surface including a processed layer and an insulating layer on a wafer is disclosed in U.S. Pat. No. 5,597,668. This technique uses a photomask provided with a dummy pattern (also referred to as "additional pattern") for forming pattern elements that do not participate in forming a circuit (hereinafter referred to as "dummy pattern elements").

Such a dummy pattern included in a photomask contributes to forming further planar processed layer on a wafer.

A photomask provided with such a dummy pattern (photomask with a dummy pattern) is formed by using pattern data including dummy pattern data. An inspection instrument inspects a photomask for defects by comparing the photomask with pattern data including dummy pattern data and decides that parts represented by data that does not coincide with the pattern data are defective.

When a photomask formed by using pattern data including dummy pattern data is inspected, the sensitivity of defect detection has been raised to cope with the increased density and advanced miniaturization of pattern elements.

The inspection instrument is set for a predetermined defect-detecting sensitivity. Usually, the defect-detecting sensitivity is defined on the basis of the size of detected defects.

A method of inspecting a photomask with a dummy pattern formed on the basis of the pattern data including dummy pattern data inspects also the dummy pattern, whose defects do not cause any problem in the circuit, at an unnecessarily high defect detection level. Therefore, parts that are determined to be defective of the dummy pattern must be examined, which affect adversely to the efficiency of inspection.

Although residual defects are removed by using a laser beam or an ion beam and vacancy defects are mended by focused-ion-beam-assisted CVD or the like, it is difficult to correct those defects completely. Thus, defects are detected sometimes when the corrected photomask is inspected again. The inspection of the photomask is performed again at an unnecessarily high defect detection level.

The conventional photomask inspecting method of inspecting a photomask for defects inspects the dummy pattern, whose defects do not cause any problem in the circuit, at an unnecessarily high defect detection level. Therefore, parts that are determined to be defective of the dummy pattern must be examined, which affect adversely to the efficiency of inspection.

DISCLOSURE OF THE INVENTION

The present invention has been made in view of the foregoing problems and it is therefore an object of the present invention to provide a photomask inspecting method for inspecting a photomask for defects capable of efficiently inspecting the photomask.

According to the present invention, a photomask inspecting method of inspecting a photomask having a design pattern and a dummy pattern, formed on the basis of photomask data designating a photomask includes: preparing defect-discriminating data for discriminating between defects in a design pattern area and those in a dummy pattern area; inspecting the photomask on the basis of the photomask pattern data designating a photomask, detecting a plurality of defects, and determining coordinates indicating the positions of the defects; discriminating between the defects in the design pattern area and those in the dummy pattern area on the basis of the positions of the defects indicated by coordinates and the defect-discriminating data; and examining the defects in the design pattern area and those in the dummy pattern area on the basis of predetermined inspection specifications corresponding to the defects in the respective areas.

The photomask inspecting method according to the present invention is characterized in preparing the defect-discriminating data designating a photomask image.

The photomask inspecting method according to the present invention is characterized in preparing the dummy pattern data designating a dummy pattern area in the photomask image.

The photomask inspecting method according to the present invention is characterized in preparing dummy pattern inhibiting data designating dummy pattern inhibiting areas as the defect-discriminating data in the photomask image.

The photomask inspecting method according to the present invention is characterized in preparing dummy pattern data designating a dummy pattern in the photomask image as the defect-discriminating data.

The expression, 'preparing the defect-discriminating data in a photomask image' signifies preparing a pattern to be formed in a photomask.

The photomask inspecting method according to the present invention is capable of efficiently inspecting photomasks.

BEST MODE FOR CARRYING OUT THE INVENTION

Preferred embodiments of the present invention will be described with reference to the accompanying drawings. A photomask with a dummy pattern will be briefly described.

Generally, a wafer processing process is completed by successively carrying out steps of depositing a polysilicon layer, an insulating layer, a wiring layer and an insulating layer. The polysilicon layer and the wiring layer are formed in patterns designated by design data. Since the patterns have lines, the surface of the processed wafer has an undulate topography.

As the insulating layer and the wiring layer are deposited successively, the step height difference between parts of the surface corresponding to the lines of the pattern and those of the same corresponding to areas in which no line is formed increases.

The allowable range of the step height difference narrows with the progressive miniaturization of patterns formed on wafers.

Figure 2:
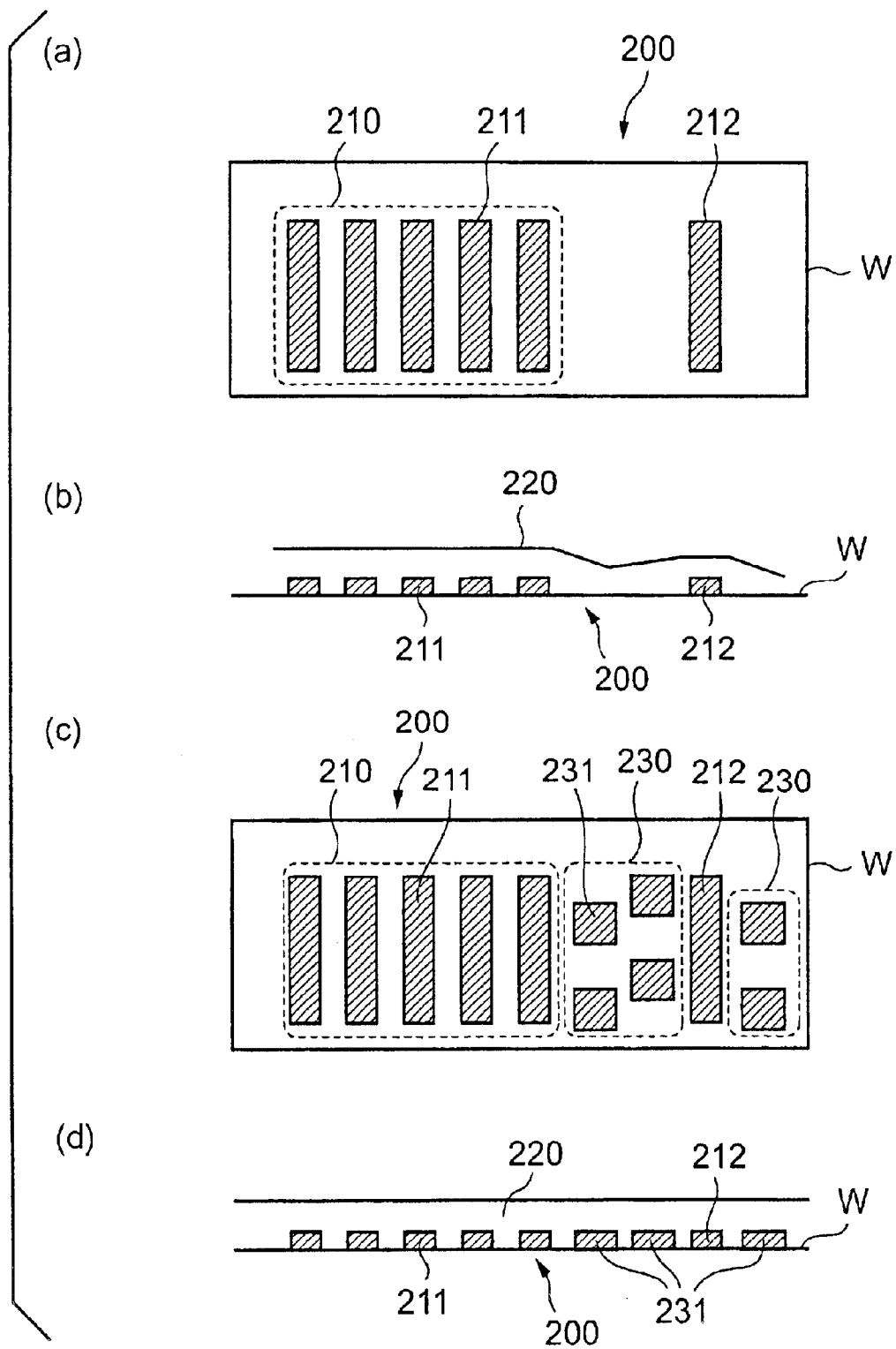
FIG. 2 is a view of a processed surface of a wafer.

The significance of a dummy pattern included in a photomask will be briefly described with reference to FIG. 2.

For example, when a wiring layer (processed layer) 200 having a design pattern 210 including closely arranged pattern lines 211, and a pattern 212 having a low pattern density is formed on a wafer W as shown in FIG. 2(a), a covering layer (insulating layer) 220 deposited on the wiring layer 200 has thickness varying according to the pattern density of the pattern as shown in FIG. 2(b). When a dummy pattern 230 having dummy pattern elements 231 is formed additionally on the wafer W as shown in FIG. 2(c) to uniformize the pattern density of the wiring layer 200, the covering layer (insulating layer) 220 deposited on the wiring layer 200 has uniform thickness as shown in FIG. 2(d).

FIGS. 2(a) to 2(d) illustrate steps of a semiconductor device fabricating process conceptually. FIGS. 2(b) and 2(d) are sectional views taken in FIGS. 2(a) and 2(c), respectively.

When the covering layer 220 is formed directly on the wafer W or the wiring layer 200 and the covering layer 220 are formed on the wafer W, the layers 200 and 220 can be more satisfactorily formed if the covering layer 220 formed on the surface of the wafer W has a higher planarity. Therefore, the layers 200 and 220 can be accurately formed on the wafer W by using a photomask when the wiring layer 200 is formed in a uniform pattern density on the wafer W.

A photomask with a dummy pattern is used for forming the dummy pattern elements 231 in addition to the wiring layer 200 formed on the wafer W. The photomask with a dummy pattern is formed on the basis of photomask data designating the photomask.

Photomask data designating the photomask with a dummy pattern will be described in connection with FIGS. 3 and 4.

Figure 3:
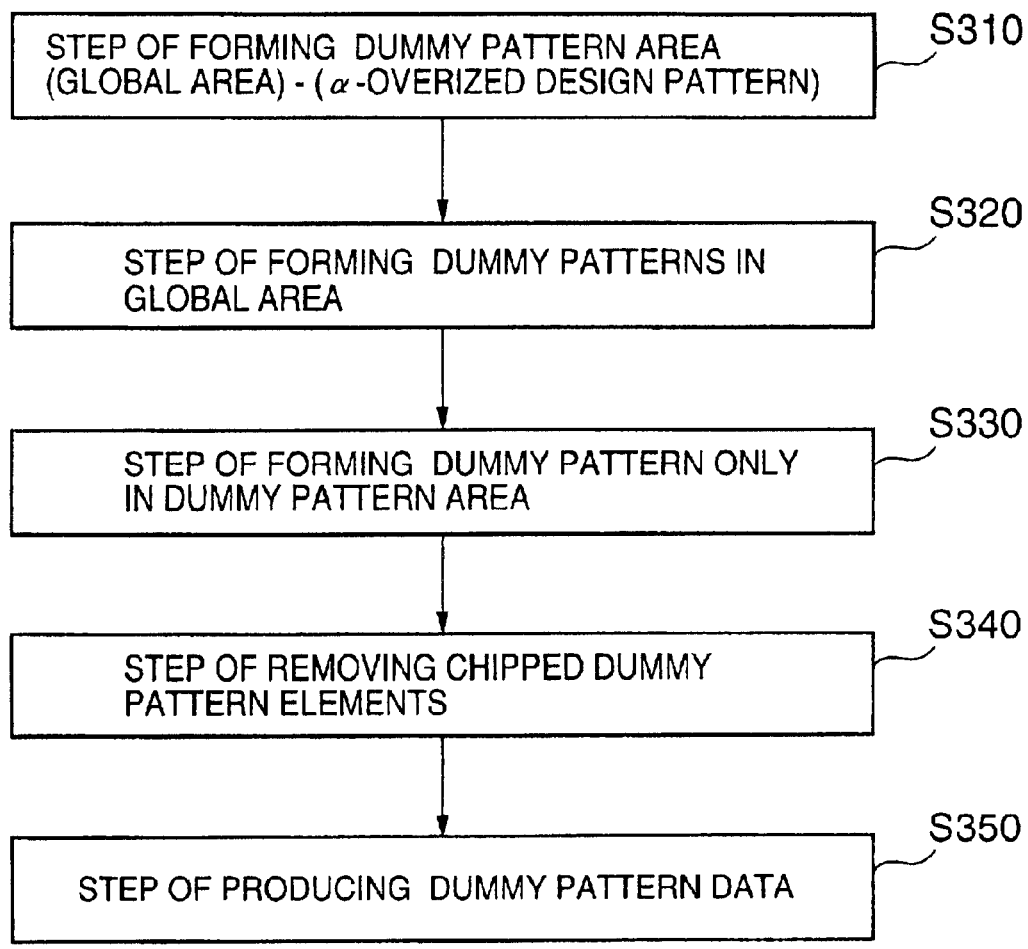
FIG. 3 is a flowchart of a data creating method of crating data designating a photomask with a dummy pattern.
Figure 4:
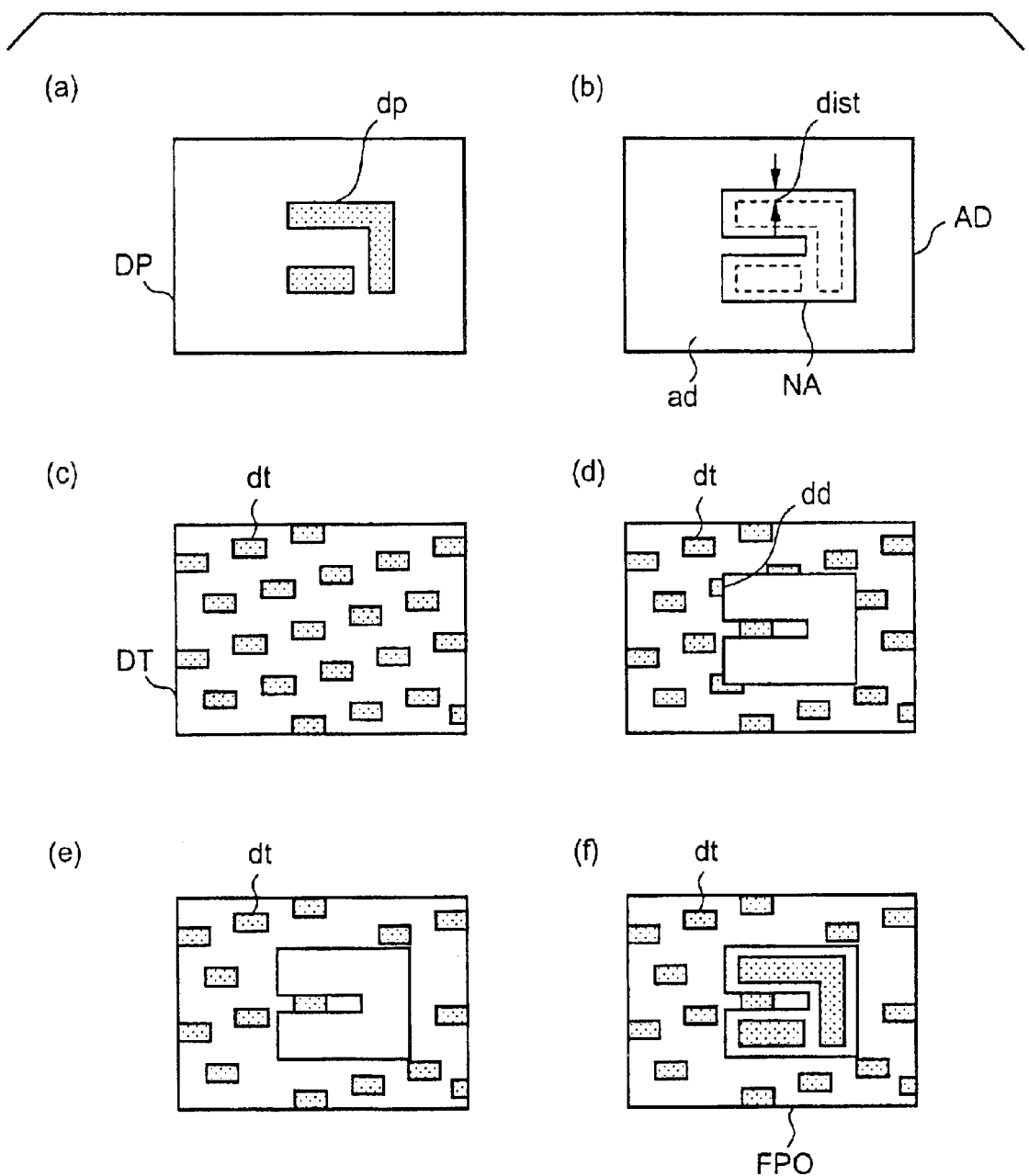
FIG. 4 is a view of patterns in steps of a data creating method of creating data designating a photomask with a dummy pattern.

In FIG. 3, S310 to S350 indicate processing steps.

A method of creating photomask data designating the photomask with a dummy pattern shown in FIG. 3 will be described with reference to an example shown in FIG. 4.

FIGS. 4(a) to 4(f) are views of patterns designated by pattern data.

In step S310 shown in FIG. 3 for forming a dummy pattern area determines an area in which a dummy pattern is formed.

In FIG. 4(a), dp indicates a design pattern (circuit pattern) included in design data DP. In FIG. 4(b), dist indicates a minimum interval between the design pattern and the dummy pattern necessary for ensuring that the design pattern and the dummy pattern are separated from each other.

The design pattern dp is processed by a sizing graphic data processing process that increases all the dimensions of the design pattern dp by a size equal to the dist to form an oversize design pattern NA. The design pattern NA is subtracted from an area designated by the design data by a logical NOT graphic data processing process to determine area data AD including dummy pattern data designating a dummy pattern area ad in which the dummy pattern is formed (FIG. 4(b)).

Then, step S320 shown in FIG. 3 for forming a dummy pattern in the global area is executed. Dummy pattern data DT designating dummy pattern elements dt arranged in the entire dummy pattern area ad is produced (FIG. 4(c)).

Usually, the dummy pattern data DT designates the rectangular dummy pattern elements dt arranged in a two-dimensional arrangement.

Then, a logical AND graphic data processing performs a logical AND operation between the area data AD and the dummy pattern data DT to determine pattern data including dummy pattern data designating dummy pattern elements only in the dummy pattern area ad (FIG. 4(d), S330).

The pattern data obtained by the logical AND graphic data processing process include pattern data designating partly chipped dummy pattern elements (small dummy pattern elements) dd.

Then, step S340 shown in FIG. 3 for removing the chipped dummy pattern elements is executed. Since the chipped dummy pattern elements cause problems in making a photomask and processing the wafer, undersizing and oversizing processes are performed. Thus, the data designating the chipped dummy pattern elements dd are removed from the pattern data to obtain adjusted pattern data designating a pattern shown in FIG. 4(e).

Then, a logical OR graphic data processing process is performed in step S350 to carry out the logical OR between the adjusted pattern data designating the pattern shown in FIG. 4(e) and the original design data DP, which combines the design data dp shown in FIG. 4(a) and the dummy pattern data designating the dummy pattern elements dt. Consequently, a final pattern data FPO designating a final pattern with a dummy pattern shown in FIG. 4(f) is obtained.

The final pattern data FPO designating the final pattern with a dummy pattern is used for making a photomask.

Figure 5:
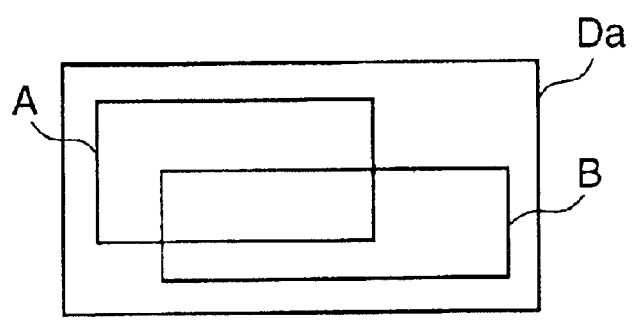
FIG. 5 is a view of assistance in explaining an arithmetic graphic data processing for processing pattern data.
Figure 5:
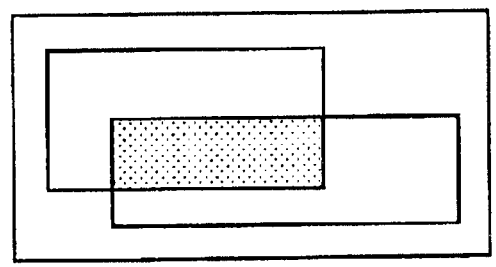
Figure 5:
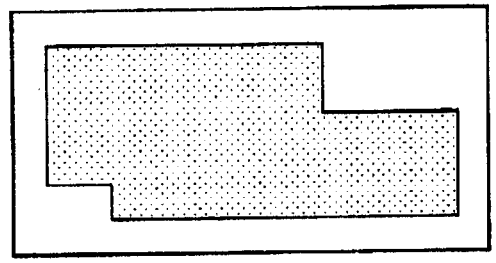
Figure 5:
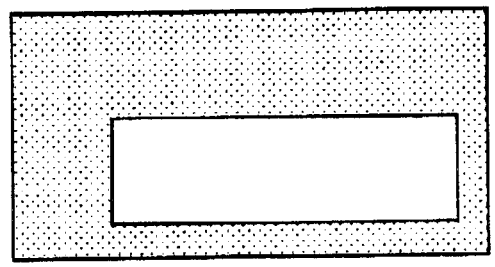

Generally, when rectangular patterns A and B are formed in a data area Da as shown in FIG. 5(a), shaded areas in FIGS. 5(b), 5(c) and 5(d) represent the logical AND between the patterns A and B, the logical OR between the patterns A and B, the inverse of the pattern B (NOT(B)), respectively.

Actual procedures of the processes are generally known and hence the description thereof will be omitted.

A photomask inspecting method in a preferred embodiment according to the present invention will be described in connection with FIG. 1.

Figure 1:
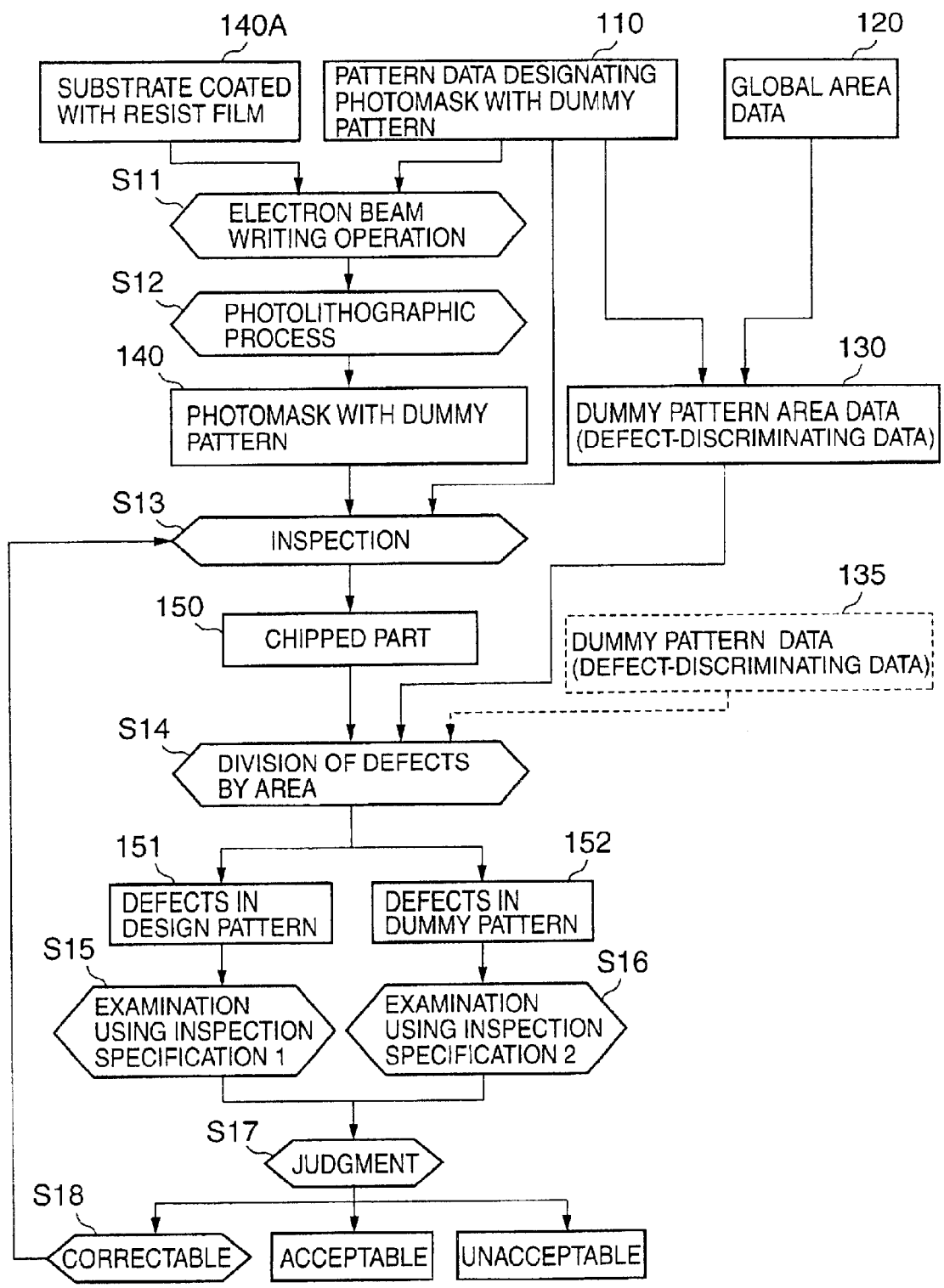
FIG. 1 is a flow chart of a photomask inspecting method of inspecting a photomask pattern according to the present invention.

Shown in FIG. 1 are photomask pattern data 110 designating a photomask with a dummy pattern, global area data 120, dummy pattern area data (defect-discriminating data) 130, dummy pattern data (defect-discriminating data) 135, a photomask 140 with a dummy pattern, a substrate 140A coated with a resist film, chipped parts (defects) 150, defects 151 in the design pattern, and detects 152 in the dummy pattern.

In FIG. 1, S11 to S18 are processing steps.

An outline of the photomask inspecting method of the present invention will be described with reference to FIG. 1.

Referring to FIG. 1, an electron beam writing operation is executed in step S11 using the photomask pattern data 110 designating a photomask with a dummy pattern to form a latent image of the photomask on a substrate, not shown. A developing process is executed in step S12 to form a photomask 140 with a dummy pattern. The photomask 140 is inspected for defects, in which defects in the design pattern based on the design data and those in the dummy pattern are detected according to respective inspection specifications.

In step S13, the photomask 140 with a dummy pattern is inspected in connection with the photomask pattern data 110 designating the photomask with a dummy pattern for defects by using an inspection instrument, such as an inspecting instrument commercially available from KLA Co., which has a predetermined detection sensitivity. Thus, sets of coordinates indicating the positions of detected defects are determined.

Thus, the positions of the defects in the design pattern formed on the basis of the design data and those in the dummy pattern are determined. At this stage, the defects in the design pattern formed on the basis of the design data and those in the dummy pattern cannot be discriminated from each other.

The inspection instrument converts the photomask pattern data 110 designating the photomask with a dummy pattern into a photomask image, and compares the photomask image with the photomask.

The photomask image corresponds to the final pattern with a dummy pattern shown in FIG. 4(f) designated by the final pattern data FPO.

A photomask image corresponding to a dummy pattern area data designating a dummy pattern area as defect-discriminating data is prepared for discriminating between the defects in the design pattern and those in the dummy pattern area.

The dummy pattern area data is obtained by subtracting the photomask pattern data 110 from the global area data designating the entire photomask image by a logical NOT graphic data processing process. The photomask pattern data designating an oversize mask image can be obtained by enlarging the photomask pattern by the predetermined dimension.

The dummy pattern area data (defect-discriminating data) 130 corresponds to the area data AD designating the pattern shown in FIG. 4(b).

Then, the coordinates of the detected defects are compared with the dummy pattern area data (defect-discriminating data) 130 by a discrimination process in step S14 to divide the defects into those in the design pattern area and those in the dummy pattern area.

In the discrimination process to be executed in step S14, image data designating a photomask image including images of a predetermined size at positions corresponding to those of the defects indicated by the coordinates of the positions of the defects is generated. Then, the image data and the dummy pattern area data 130 of the photomask image are compared by a logical AND graphic data processing process to discriminate between the defects in the design pattern area and those in the dummy pattern area.

After that, the discriminated defects are identified according to separate inspection specifications suitable for defects in the design pattern area and those in the dummy pattern area respectively. The defects are enlarged and measured with a scale or the like for identification.

Defects found in the design pattern area designated by the design data are examined according to a severe inspection specification 1 in step S15, while defects found in the dummy pattern area are examined according to an inspection specification 2 less severe than the inspection specification 1 in step S16. The results of both the examination of the defects in the design pattern area and that of the defects in the dummy pattern area are examined in combination in order to decide whether the photomask be corrected, the photomask be accepted or the photomask be rejected in step S17.

No problem arises when a size of, for example, 0.15–0.2 $\mu$m dependent on a design rule is found for examining the defects in the design pattern area designated by the design data, and a size greater than 0.2 $\mu$m is found by the inspection specification for examining the defects in the dummy pattern area.

When the defects are corrected in step S18, steps S13 to S17 are repeated.

Thus, inspection and correction are repeated to obtain an acceptable photomask by correcting correctable defects.

A modification in the photomask inspecting method of the present invention will be described. Dummy pattern inhibiting area data designating a dummy pattern inhibiting area as a discrimination area in a photomask image may be used instead of the dummy pattern area data. In this case, the coordinates indicating the positions of defects detected by the inspection process are compared with the dummy pattern inhibiting area data to decide whether the defects are in the design pattern area or in the dummy pattern area.

Such a discrimination process is achieved by a logical AND graphic data processing process.

A further modification in the photomask inspecting method of the present invention will be described. Dummy pattern data 135 designating only a dummy pattern in a photomask image may be used as the defect-discriminating data for discriminating between the defects in the design pattern area and those in the dummy pattern area instead of the dummy pattern area data. The dummy pattern data 135 includes a pattern corresponding to the pattern shown in FIG. 4(e). The coordinates indicating the position of the defects detected by the inspection process are compared with the dummy pattern data 135 to decide whether the defects are in the design pattern area or in the dummy pattern area (step S14 in FIG. 1).

The execution of this discrimination process is dependent on whether or not the pattern designated by the dummy pattern data 135 is spaced a predetermined distance apart from the position of the defect in a predetermined direction.

As apparent from the foregoing description, according to the present invention, a photomask with a dummy pattern can be efficiently inspected. The efficiency of inspection can be improved by examining defects in the design pattern area designated by the design data and those in the dummy pattern area according to separate inspection specifications.

What is claimed is:

1. A photomask inspecting method for inspecting a photomask having a design pattern and a dummy pattern, formed on the basis of photomask data, said photomask inspecting method comprising:

preparing defect-discriminating data for discriminating between defects in a design pattern area and defects in a dummy pattern area of a photomask to be inspected;

inspecting such photomask on the basis of photomask pattern data, detecting a plurality of defects in such photomask, and determining coordinates indicating positions of such defects;

discriminating between defects in the design pattern area and defects in the dummy pattern area on the basis of said positions of such defects and the defect-discriminating data; and examining defects in the design pattern area and defects in the dummy pattern area on the basis of predetermined inspection specifications corresponding to defects in respective areas of such photomask.

2. The photomask inspecting method according to claim 1, wherein the defect-discriminating data designates a photomask image.

3. The photomask inspecting method according to claim 2, wherein the defect-discriminating data is dummy pattern data designating the dummy pattern area in the photomask image.

4. The photomask inspecting method according to claim 2, wherein the defect-discriminating data is dummy pattern inhibiting data designating dummy pattern inhibiting areas in the photomask image.

5. The photomask inspecting method according to claim 2, wherein the defect-discriminating data is dummy pattern data designating a dummy pattern in the photomask image.

* * * * *